United States Patent [19]

Kolwicz

[11] Patent Number: 4,633,571
[45] Date of Patent: Jan. 6, 1987

[54] METHOD OF MANUFACTURING A CMOS CELL ARRAY WITH TRANSISTOR ISOLATION

[75] Inventor: Kevin D. Kolwicz, Allentown, Pa.

[73] Assignee: AT&T Bell Laboratories, Murray Hill, N.J.

[21] Appl. No.: 782,911

[22] Filed: Oct. 2, 1985

Related U.S. Application Data

[62] Division of Ser. No. 600,969, Apr. 16, 1984, Pat. No. 4,570,176.

[51] Int. Cl.$^4$ .............................................. H01L 29/78
[52] U.S. Cl. ..................................... 29/571; 29/576 B; 29/576 W; 148/15
[58] Field of Search ................ 29/571, 516 B, 576 W, 29/578; 427/93, 38, 85; 148/1.5, DIG. 82; 357/42, 45, 59, 91; 250/492.2

[56] References Cited

U.S. PATENT DOCUMENTS 4,345,366  8/1982  Brower .................................. 29/571
4,516,312  5/1985  Tomita .................................. 29/571

OTHER PUBLICATIONS

"Gate Array and Custom VLSIC . . . ", *Proceedings of the 1982 Custom Integrated Circuits Conference*, May 17-19, 1982, A. London et al., pp. 90-95.
"CMOS Gate Arrays . . . ", *Proceedings of the 1982 Custom Integrated Circuits Conference*, May 17-19, 1982, M. Insley et al. pp. 304-306.
"Gate Isolation-A Novel Basic . . . ", *Proceedings of the 1982 Custom Integrated Circuits Conference*, May 17-19, 1982, pp. 307-310, I. Ohkura et al.
*Computer Design*, "CMOS Logic Arrays: A Design Direction", pp. 237-245, R. Walker et al., May 1982.
"16b CPU Design by a Hierarchical . . . ", *Proceedings of the ICCC* 1982, Sep. 28-Oct. 1, 1982, pp. 102-105, T Tokuda.
"A 6K-Gate CMOS Gate Array", *IEEE Journal of Solid-State Circuit*, H. Tago et al., pp. 907-912, vol. SC-17, No. 5, Oct. 1982.
"A CMOS/SOS Gate Array . . . ", *IEEE Transactions on Electron Devices*, vol. ED-29, No. 10, Oct. 1982, N. Sasaki et al.
"Automation Advances for CMOS . . . ", *Electronic Design*, Dec. 9, 1982, pp. 155-162, E. J. Schmitt et al.
"A 10K Gate CMOS Gate Array . . . ", *Proceedings of the 1983 Custom Integrated Circuits Conference*, K. Sakashita et al., pp. 14-18, May 23-25, 1983.
"A 432-Cell GaAs SDFL . . . ", *Proceedings of the 1983 Custom Integrated Circuits Conference*, T. Vu et al., pp. 32-36, May 23-25, 1983.
"Advanced Architecture (Channel-Less) . . . ", *Proceedings of the 1983 Custom Integrated Circuits Conference*, May 23-25, 1983, R. Lipp, pp. 71-73.
"Layout and Design Criteria . . . ", *Proceedings of the 1983 Custom Integrated Circuits Conference*, S. L. Hurst et al., pp. 322-326, May 23-25, 1983.

*Primary Examiner*—Brian E. Hearn
*Assistant Examiner*—John T. Callahan
*Attorney, Agent, or Firm*—Wendy W. Koba

[57] ABSTRACT

A new technique for forming CMOS custom logic circuits is disclosed wherein standard cells (10,12,14) are used and the prior art technique of field oxide isolation (16) is replaced with transistor isolation (68-71). That is, the boundaries (18,20,22,24) between the cells are formed by transistors that are permanently "off", i.e., tied to the positive or negative voltage supply, depending on whether the transistors are p-channel or n-channel devices, respectively. Therefore, instead of having to deposit separate p+ and n+ source/drain diffusions for each cell, as in the prior art, a single p+ diffusion strip (60) and a single n+ diffusion strip (62) are utilized, where the polysilicon mask of both the logic and isolation transistors defines the cell sizes. Thus, the p+ and n+ diffusions become generic steps which do not vary from circuit to circuit, decreasing the turnaround time associated with custom logic circuit layout and design.

5 Claims, 5 Drawing Figures

METHOD OF MANUFACTURING A CMOS CELL ARRAY WITH TRANSISTOR ISOLATION

This is a division of application Ser. No. 600,969 filed Apr. 16, 1984 now U.S. Pat. No. 4,570,176.

BACKGROUND OF THE INVENTION

1. Field of the Invention

The present invention relates to a technique for forming custom logic integrated circuits utilizing CMOS cell arrays and, more particularly, to the utilization of a transistor isolation technique, in lieu of field oxide isolation, to combine the advantages of the gate array and standard cell design processes.

2. Description of the Prior Art

In designing custom logic circuits, which often include many thousands of separate devices, automated design and layout techniques must be utilized which provide quick turnaround time to avoid spending many valuable hours attempting to manually produce a workable and efficient logic circuit design. There are two popular approaches in the prior art to providing this quick turnaround, standard cell (polycell) design and gate array design.

Integrated circuits designed with polycells, or precharacterized groups of transistors capable of performing a specific function, offer a great deal of flexibility in terms of final circuit function. One such design arrangement is discussed in the article "16*b* CPU Design by a Hierarchical Polycell Approach" by T. Tokuda et al, appearing in the *Proceedings of the IEEE International Conference on Circuits and Components* (ICCC 82), September 28–October 1, 1982, at pp. 102–5. The standard cell approach offers a rich library of functions, or precharacterized cells, allowing the designer to create virtually any logic circuit desired. A drawback of this approach, however, is that since each polycell definition contains all of the mask level for the entire logic circuit and it is impossible to predict where the various geometries on the different mask levels will finally be placed, it is necessary to respecify all mask levels for each new circuit and accordingly have to wait for all these levels to be processed for initial circuit evaluation. It is not unusual for a custom logic circuit to require ten or more mask levels, thus requiring an extended processing interval.

The gate array concept of circuit design addresses this long processing turnaround problem by having, on partially preprocessed wafers, predefined circuit elements which are isolated from one another by a thick oxide region and only require interconnection processing steps to form the completed circuit. Hence, in this case a designer needs only to specify the interconnection of these preplaced transistors or groups of transistors to implement a given LSI circuit design. As the transistor placement is known, silicon wafers containing these transistors can be preprocessed up to but excluding the interconnection mask levels. The few remaining mask levels (typically two to four levels) necessary for interconnection will then be processed to implement a specific function. A complete description of an exemplary gate array design technique can be found in the article "CMOS Gate Arrays: Design Techniques and Tradeoffs" by M. Insley et al appearing in the *Proceedings of the 1982 Custom Intergrated Circuits Conference*, May 17–19, 1982 at pp. 304–6. The gate array technique, however, is inherently limited to designing with partially preprocessed wafers, restricting the number of functions for the designer to chose from and thereby limiting the amount of customizing the designer may do.

One technique for increasing the customization possible with gate arrays is discussed in the article "A CMOS/SOS Gate Array with a New Customization Technique of Cutting" by N. Sasaki et al appearing in *IEEE Transactions on Electron Devices*, Vol. ED-29, No. 10, October 1982 at pp. 1535–1541. As discussed by the authors, customization of the silicon wiring level is realized by arbitrarily cutting the pre-defined epitaxial-silicon lines into many pieces after the fabrication of the transistors. Customization at the silicon wiring level results in higher packing density and reduction of the silicon wiring channels by a factor of two. Another problem with gate arrays, however, is that the thick field oxide regions, which separate the transistor pairs forming the basic circuit elements, occupy a large portion of the gate array structure. This factor appreciably reduces the number of actual circuit elements which may be included in the complete logic circuit. One solution to this problem is to utilize "gate isolation" in place of the field oxide regions to separate the circuits. This concept is discussed in detail in an article entitled "Gate Isolation-A Novel Basic Cell Configuration for CMOS Gate Arrays" by I. Ohkura et al appearing in *Proceedings of the 1982 Custom Integrated Circuits Conference*, May 17–19, 1982 at pp. 307–310. In particular, the gate isolation method proposes forming the basic CMOS cell out of a single transistor pair, where the transistor pairs are arranged in a row, closely spaced, without oxide isolation, resulting in a serial p-channel transistor chain and a serial n-channel transistor chain. A master slice gate array formed by this method is discussed in the article "A 10K Gate CMOS Gate Array with Gate Isolation Configuration" by K. Sakashita et al appearing in *Proceedings of the 1983 Custom Integrated Circuits Conference*, May 23–25, 1983 at pp. 14–18. A problem with this gate isolation approach, however, is that many standard cell definitions require at least two or three n- and p-channel transistor pairs and, therefore, cannot be utilized since the gate isolation standard cell contains only one transistor pair. Further, many more interconnections between cells are necessary in this configuration than are needed in custom logic circuits formed by the prior art methods discussed above.

Thus, there remains to desire to provide a method of achieving custom logic integrated circuit design which can provide quick turnaround time without the disadvantages of thick field oxide isolation or cell definition restrictions related to the above-cited methods.

SUMMARY OF THE INVENTION

The present invention relates to an improved method for achieving quick turnaround custom logic integrated circuit design by utilizing CMOS cell arrays and, more particularly, to the utilization of a transistor isolation technique, in lieu of field oxide isolation, to combine the advantages of the gate array and standard cell design processes.

It is an aspect of the present invention to provide a technique which uses both the partially preprocessed wafers of gate arrays and the flexibility and computer-aided-design (CAD) facilities of the standard cell approach.

A further aspect of the present invention is to employ transistor isolation in the standard cell to provide the preprocessing of gate arrays and allow flexibility in cell placement. This allows the wafers to be preprocessed with all the necessary diffusions, where final transistor size and placement are part of the isolation and add to the flexibility of the design.

Another aspect of the present invention is to provide a design method capable of employing all of the CAD tools already available with the standard cell approach, thereby giving the designer more options in creating a custom logic integrated circuit.

Other and further aspects of the present invention will become apparent during the course of the following discussion and by reference to the accompanying drawings.

BRIEF DESCRIPTION OF THE DRAWING

Referring now to the drawings.

DETAILED DESCRIPTION

Figure 1:
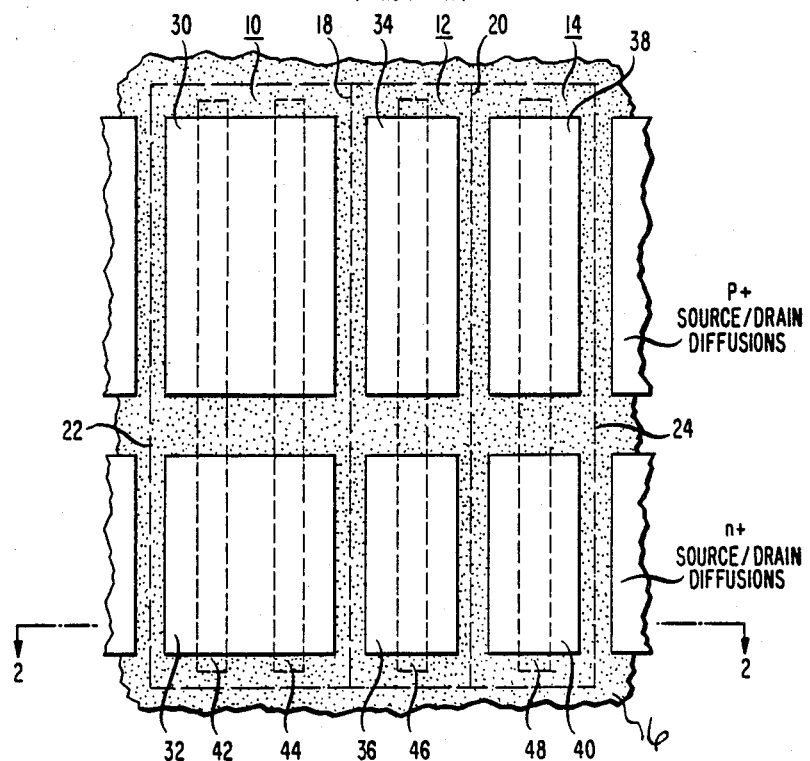
FIG. 1 illustrates an exemplary cell arrangement designed using the prior art standard cell technique with field oxide isolation.

A prior art standard cell, in CMOS technology, formed using field oxide isolation is illustrated in FIG. 1. Three cells 10, 12, and 14 are shown, separated by regions of field oxide 16 along cell boundaries 18 and 20, where in this exemplary arrangement field oxide 16 is SiO$_2$. Cell boundaries 22 and 24, which separate cells 10 and 14 from the remaining cells (not shown) are also formed from field oxide 16. As shown, each cell comprises a separate p+ source/drain diffusion and an n+ source/drain diffusion. In particular, cell 10 comprises a p+ source/drain diffusion 30 and an n+ source/drain diffusion 32, cell 12 comprises a p+ diffusion 34 and an n+ diffusion 36, and cell 14 comprises a p+ diffusion 38 and an n+ diffusion 40.

The logic transistors included in the CMOS array are formed, as is well known in the art, by the intersection of a polysilicon mask with the separate p+ and n+ diffusions. Thus, by programming the polysilicon mask, the location and interconnection of the logic transistors can be controlled to form whatever logic circuit is desired. For example, in the arrangement illustrated in FIG. 1, cell 10 contains two logic transistor pairs 42 and 44, cell 12 contains a single logic transistor pair 46 and similarly, cell 14 contains a single logic transistor pair 48.

Figure 2:
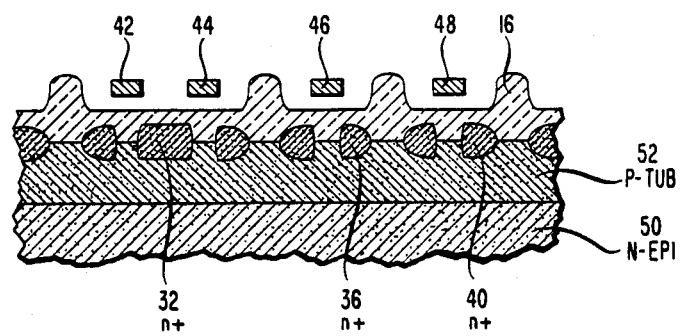
FIG. 2 illustrates a cross-sectional view of the exemplary cell arrangement of FIG. 1.

A cross-sectional view of this exemplary prior art arrangement is illustrated in FIG. 2. The view of FIG. 2 also illustrates an n epitaxial layer 50 and a p-tub layer 52, both of which are necessary layers in forming a CMOS logic circuit. Although it cannot be seen in this cross-sectional view, an n-tub layer may also, but does not necessarily have to, be formed on n epitaxial layer 50, concomitant with p-tub layer 52. Both the n-tub and p-tub layers are necessary in the "twin-tub" CMOS process. A complete description of this CMOS process, which is useful but not necessary for the understanding of the present invention, can be found in the article "Twin-Tub CMOS - A Technology for VLSI CIrcuits" by L. C. Parrillo et al appearing in *International Electron Devices Meeting, Technical Digest*, Dec. 8–10, 1980 at pp. 752–755. As shown in FIG. 2, field oxide 16 does not comprise a flat profile, rather the SiO$_2$ layer forming field oxide 16 is grown to the same height as the polysilicon mask at cell boundaries 16, 18, 20, and 22. Thus, as can be seen from the above description, the processing involved in this prior art method is somewhat intricate. In particular, separate p+ and n+ source/drain diffusions are needed for each cell, which once set cannot be modified without re-doing all of the steps beyond the formation of the tub layers.

Figure 3:
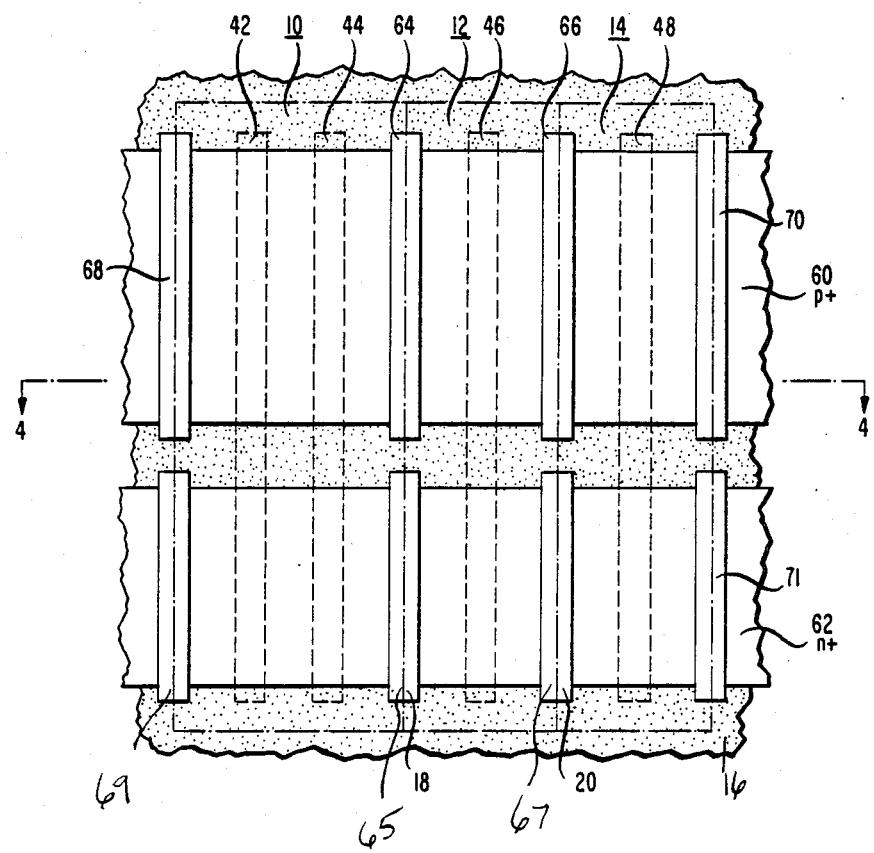
FIG. 3 illustrates an exemplary cell arrangement designed utilizing the transistor isolation technique of the present invention.

An exemplary arrangement of the same three cells 10, 12, and 14 formed using the transistor isolation technology of the present invention is illustrated in FIG. 3. As shown, FIG. 3 includes the same cells 10, 12, and 14 separated by the same cell boundaries 18, 20, 22, 24. In contrast to the prior art arrangement, however, separate p+ and n+ source/drain diffusion regions separated by field oxide are not required. Rather, a pair of thin oxide diffusion strips 60 and 62 are utilized in accordance with the present invention, where these strips comprise whatever length is necessary to include the number of cells desired. During a subsequent implant step, diffusion strip 60 is p+ doped and diffusion strip 62 is n+ doped. Thus, unlike the prior art arrangement where the separate p+ and n+ diffusion regions must be part of the customization process, these p+ and n+ diffusion strips of the present invention are "generic" layers, like n-epi layer 50, which do not vary from circuit design to circuit design, thus significantly decreasing the turnaround time associated with design and layout of custom logic integrated circuit.

In comparing FIG. 3 with prior art FIG. 1, the arrangement of cells 10, 12, and 14 in FIG. 3 contains the same logic transistor pairs 42, 44, 46, and 48 shown in FIG. 1. However, in accordance with the present invention, field oxide 16 is not used to separate cells 10, 12, and 14. Rather, the isolation is achieved by utilizing additional pairs of logic transistors that are permanently "off" in the circuit. That is, the gates of the p-channel devices are permanently tied to the positive power supply and the gates of the n-channel devices are permanently tied to the negative power supply. As shown in FIG. 3, a pair of isolation transistors 64 and 65 are positioned at cell boundary 18 between cells 10 and 12, where isolation transistor 64 is connected to the positive power supply (5V) and isolation transistor 65 is connected to the negative power supply (OV). In a similar manner, a pair of isolation transistors 66 and 67 are positioned at cell boundary 20 and connected to the positive and negative power supplies, respectively. Likewise, a pair of isolation transistors 68 and 69 are positioned at cell boundary 22 and a pair of isolation 70 and 71 are positioned at cell boundary 24. In accordance with the present invention, isolation transistors 68–71 are identical in form and composition to logic transistor pairs 42, 44, 46 and 48, and are, in fact, included in the logic circuit during the same processing step as the logic transistor pairs. The only difference between the two types of transistors is that those transistors which are used for isolation purposes are maintained permanently "off".

Figure 4:
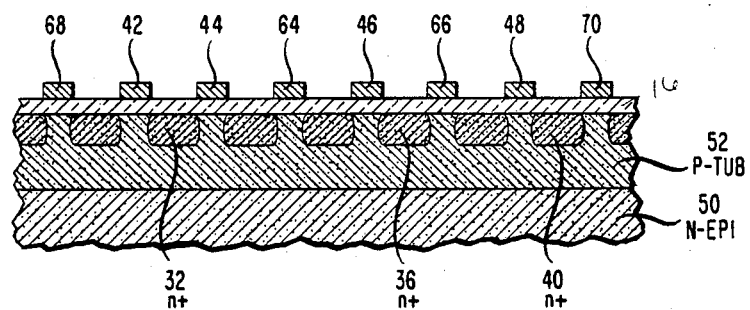
FIG. 4 illustrates a cross-sectional view of the exemplary cell arrangement of FIG. 3.

A cross-sectional view of this arrangement of the present invention is illustrated in FIG. 4. As shown, field oxide diffusion 16 is a flat profile layer and can be processed as one of the generic steps in forming a custom logic integrated circuit in accordance with the present invention. In this view, isolation transistors 65, 67, 69 and 71 are illustrated and coupled to ground (where in this example ground is the negative power supply), thereby achieving the separation between cells 10, 12, and 14 in n+ diffusion strip 62 to form n+ diffusion regions 32, 36, and 40.

In accordance with the present invention, therefore, at least three of the customization steps in the process of forming a custom logic IC ($SIO_2$ field oxide, p+ source/drain diffusions, and n+ source/drain diffusions) are replaced by generic diffusion layers which can significantly decrease the turnaround time. Further, as seen by reference to FIGS. 1-4, the structure of the individual cells comprising the transistor isolated cell arrangement is identical to the structure of the cells in the prior art field oxide arrangement. Thus, the same software used to generate the standard cell library may be used in association with the techniques of the present invention, and circuits which have previously been designed using the standard cell approach can easily be processed using the transistor isolation techniques of the present invention.

Figure 5:
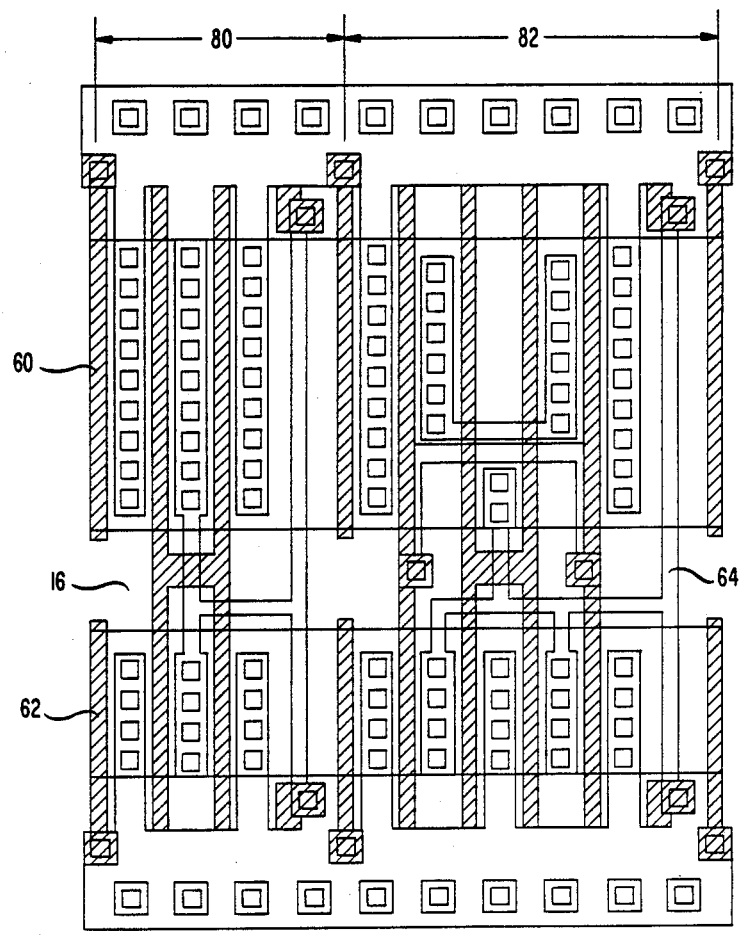
FIG. 5 illustrates a generic cell formed in accordance with the present invention before any customization has taken place.

FIG. 5 illustrates a generic wafer formed using the techniques of the present invention, before the inclusion of any of the customization steps necessary to produce a complete custom logic circuit. The sites for the standard cells are the predefined p- and n- well strips 60 and 62, respectively, located in the center of the wafer. The variable width cells, denoted 80 and 82 are place in strips 60 and 62 and interconnected in routing region 64 (formed of field oxide 16) between strips 60 and 62. It is to be noted that in accordance with the present invention, a particular cell may contain any number of transistor pairs since the width of the cell is only a function of the placement of the isolation transistors. This fact can, in the future, lead to the inclusion of standard cells in the CAD library which contain four, five, or more transistor pairs, greatly increasing the design options available.

What is claimed is:

1. A method for producing a CMOS custom logic circuit including a plurality of cells separated from one another by a cell boundary, each cell including at least one complementary logic transistor pair, the method including the steps of
    (a) depositing a first, continuous thin oxide strip onto a substrate material;
    (b) depositing a second, continuous thin oxide strip onto said substrate material parallel to said first strip and separated therefrom by a predetermined distance;
    (c) implanting ions of a first conductivity type in said first, continuous thin oxide strip;
    (d) implanting ions of a second conductivity type in said second, continuous thin oxide strip;
    (e) growing a field oxide region on said substrate between said first and second continuous strips;
    (f) depositing a polysilicon patterned mask layer on said first and second continuous strips to form, in association with said first and second continuous strips, a plurality of transistors wherein selected sets from said plurality of transistors form logic transistors and are included in said plurality of cells, and selected others of said plurality of transistors form a plurality of isolation transistors and are permanently connected to either one of a positive voltage supply and a negative voltage supply for isolating said plurality of cells from one another and forming the cell boundaries.

2. The method according to claim 1 wherein the plurality of isolation transistors are formed in pairs, the first transistor of each pair disposed across the first continuous strip of the first conductivity type and the second transistor of each pair positioned in line with its associated first transistor and disposed over the second continuous strip of the second conductivity type.

3. The method according to claim 1 wherein the first continuous strip comprises a p+ type diffusion layer and the second continuous strip comprises an n+ type diffusion layer.

4. The method according to claim 3 wherein each isolation transistor disposed over the first continuous strip is connected to the positive voltage supply and each isolation transistor disposed over the second continuous strip is connected to the negative voltage supply.

5. The method according to claim 1 wherein the positive voltage supply is five volts and the negative voltage supply is zero volts.

* * * * *